United States Patent
Yu

(10) Patent No.: US 7,233,500 B2
(45) Date of Patent: Jun. 19, 2007

(54) CARD CONNECTOR

(75) Inventor: Hoder Yu, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/396,106

(22) Filed: Mar. 31, 2006

(65) Prior Publication Data

US 2007/0053170 A1 Mar. 8, 2007

(30) Foreign Application Priority Data

Aug. 9, 2005 (CN) .......................... 2005 2 0062645

(51) Int. Cl.
*H05K 1/14* (2006.01)
(52) U.S. Cl. ...................... 361/737; 361/683; 361/686; 439/60
(58) Field of Classification Search ........ 361/801–802, 361/727, 737, 683–686; 439/377, 327, 157, 439/159, 60
See application file for complete search history.

(56) References Cited

U.S. PATENT DOCUMENTS 5,429,523 A * 7/1995 Tondreault .................. 439/157
5,676,555 A * 10/1997 Yu et al. ..................... 439/157

* cited by examiner

*Primary Examiner*—Tuan Dinh
*Assistant Examiner*—Hung S. Bui
(74) *Attorney, Agent, or Firm*—Frommer Lawrence & Haug LLP; Ronald R. Santucci

(57) ABSTRACT

A card connector includes a card-mounting seat formed with an insertion groove that is defined by opposite end walls, opposite side walls and a bottom wall. Each end wall has two opposite upright extension wall portions defining a receiving groove therebetween. Two anchoring blocks are connected pivotally and respectively to the extension wall portions of the end walls of the card-mounting seat. When an insertion side of an electronic card is inserted into the insertion groove in the card-mounting seat, conductive members, which are mounted in the card-mounting seat, contact electrically and respectively conductive terminals of the electronic card, and a protrusion of one of the anchoring blocks engages a notch in a lateral side of the electronic card while the electronic card is anchored between the anchoring blocks.

6 Claims, 6 Drawing Sheets

CARD CONNECTOR

CROSS-REFERENCE TO RELATED APPLICATION

This application claims priority of Chinese Application No. 200520062645.4, filed on Aug. 9, 2005.

BACKGROUND OF THE INVENTION

1. Field of the Invention

The invention relates to a card connector, more particularly to a card connector that can effectively avoid insertion of a non-matching electronic card thereinto.

2. Description of the Related Art

FIG. 1 illustrates a conventional card connector 10 for use only with an electronic card that is a fully buffered dual in line memory module (FB DIMM) card 9 and that has an insertion side 91, and opposite lateral sides 93, each of which is formed with a notch 932. In this case, the presence of the notches 932 in the electronic card 9 is used to distinguish from a double date rate memory module (DDR) card 9' shown in FIG. 2 since the FB DIMM card 9 and the DDR card 9' have the same size and terminal specification. As a result, the conventional card connector 10 also permits insertion of the non-matching DDR card 9' thereinto. Therefore, insertion of only matching electronic cards into the conventional electronic card 10 cannot be ensured during use.

SUMMARY OF THE INVENTION

Therefore, the object of the present invention is to provide a card connector that can effectively avoid insertion of a non-matching electronic card thereinto.

According to the present invention, there is provided a card connector for an electronic card having a rectangular card body. The card body has an insertion side formed with a plurality of conductive terminals, and opposite lateral sides, one of which is formed with a notch disposed adjacent to the insertion side of the card body. The card connector comprises:

a card-mounting seat having a top surface formed with an insertion groove, which is defined by opposite end walls, opposite side walls and a bottom wall, and which permits insertion of the insertion side of the card body of the electronic card thereinto, each of the end walls having two opposite upright extension wall portions that extend upwardly and that are aligned respectively with the side walls, the extension wall portions of each of the end walls defining a receiving groove therebetween, each of the receiving grooves being in spatial communication with the insertion groove;

a plurality of conductive members mounted in the card-mounting seat, each of the conductive members having a contact end portion extending into the insertion groove in the card-mounting seat, and a connecting end portion opposite to the contact end portion and extending outwardly of the card-mounting seat through the bottom wall of the card-mounting seat, the contact end portions of the conductive members being adapted to contact electrically and respectively the conductive terminals of the electronic card when the insertion side of the card body of the electronic card is inserted into the insertion groove in the card-mounting seat; and two anchoring blocks each connected pivotally to the extension wall portions of a corresponding one of the end walls of the card-mounting seat, each of the anchoring blocks having an operating end portion that extends outwardly of a corresponding one of the receiving grooves, an ejecting end portion opposite to the operating end portion and disposed in the insertion groove in the card-mounting seat, and an intermediate coupling portion interconnecting the operating end portion and the ejecting end portion, disposed in the corresponding one of the receiving grooves, and extending into the insertion groove in the card-mounting seat.

When the insertion side of the card body of the electronic card is inserted into the insertion groove in the card-mounting seat, the operating end portions of the anchoring blocks are operable so as to enable each of the anchoring blocks to move between an anchoring position, where the operating end portions of the anchoring blocks are moved toward each other such that the card body of the electronic card is anchored between the operating end portions of the anchoring blocks, and where the ejecting end portions of the anchoring blocks are adapted to abut against the insertion side of the card body of the electronic card, and a releasing position, where the operating end portions of the anchoring blocks are moved away from each other, and where the ejecting end portions of the anchoring blocks are moved inwardly and upwardly toward each other such that the insertion side of the cardbodyof the electronic card is pushed upwardly by the ejecting end portions of the anchoring blocks to separate from the insertion groove in the card-mounting seat.

The intermediate coupling portion of one of the anchoring blocks has a protrusion that is adapted to engage the notch in said one of the lateral sides of the card body of the electronic card when said one of the anchoring blocks is disposed in the anchoring position.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
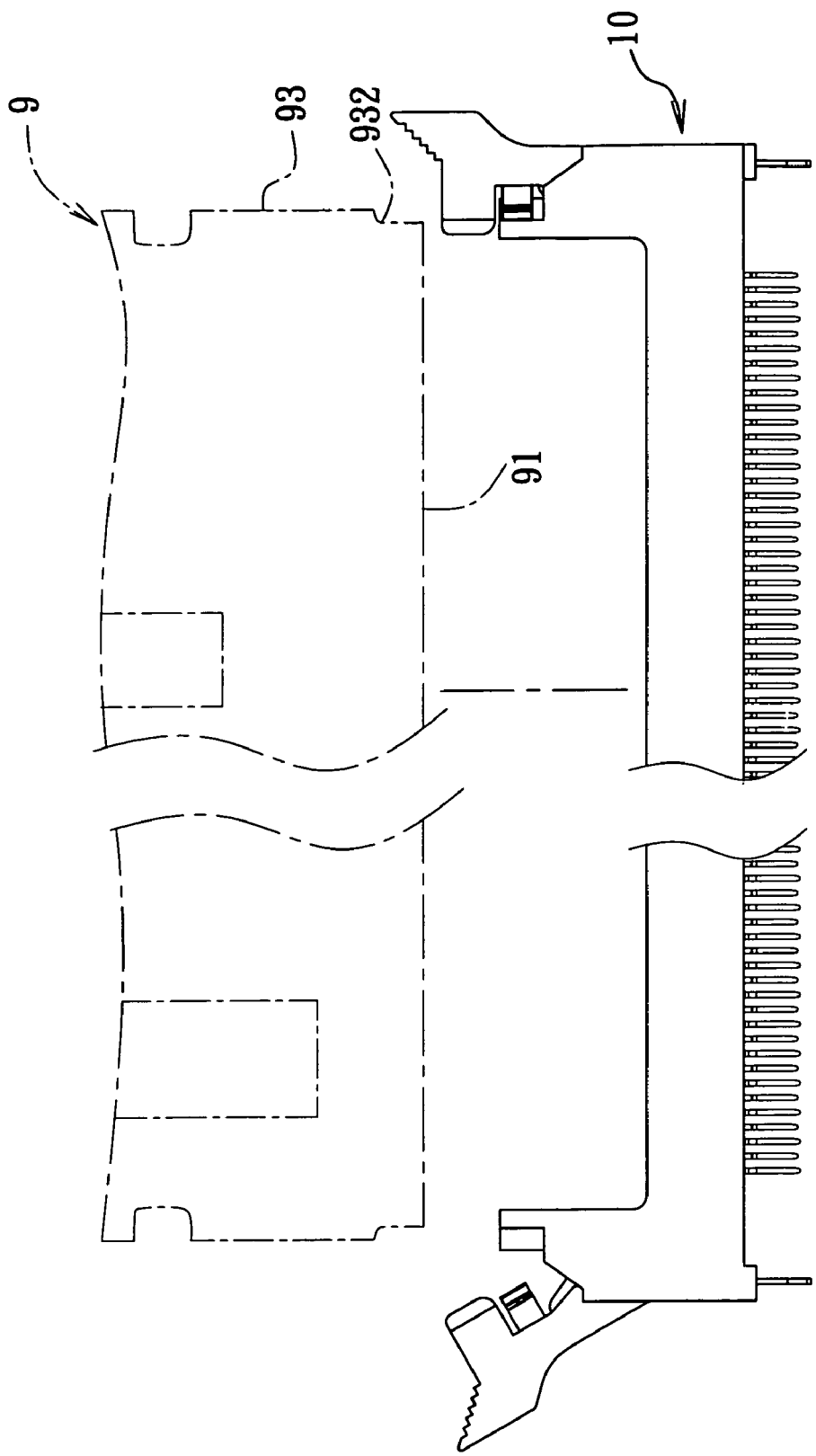
FIG. 1 is a schematic view showing a conventional card connector for use with an electronic card.
Figure 2:
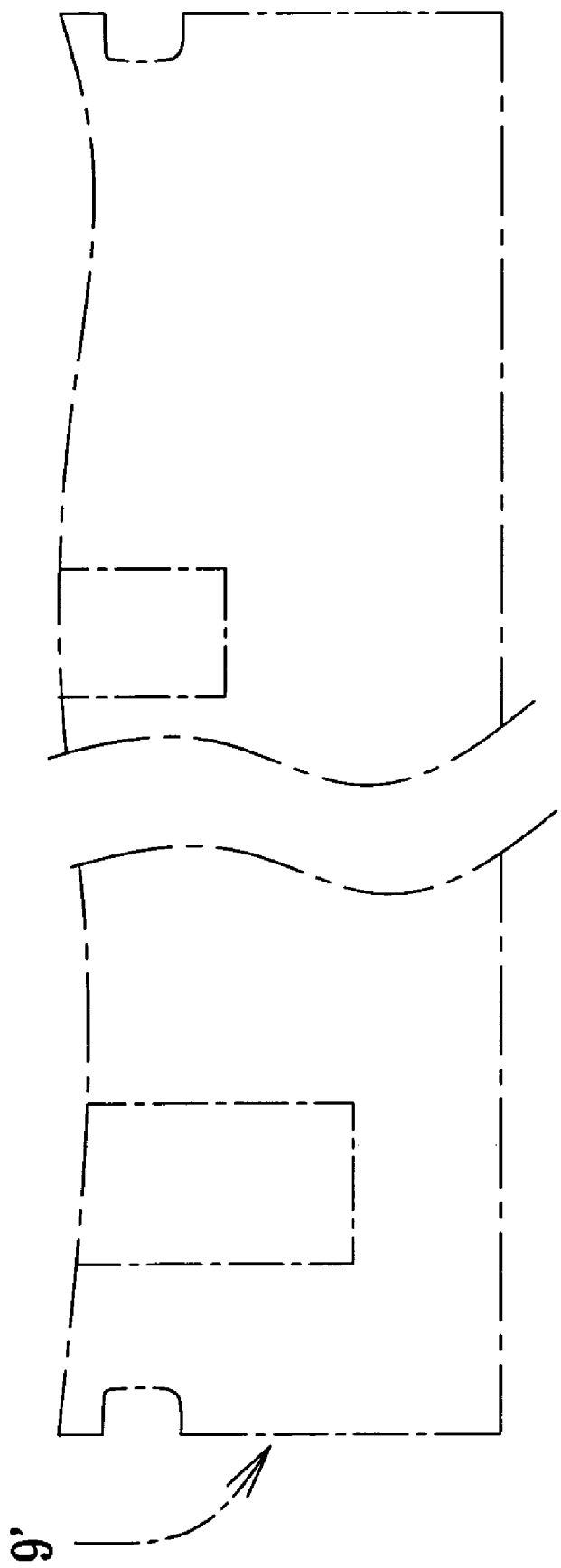
FIG. 2 is a schematic view of another electronic card.
Figure 3:
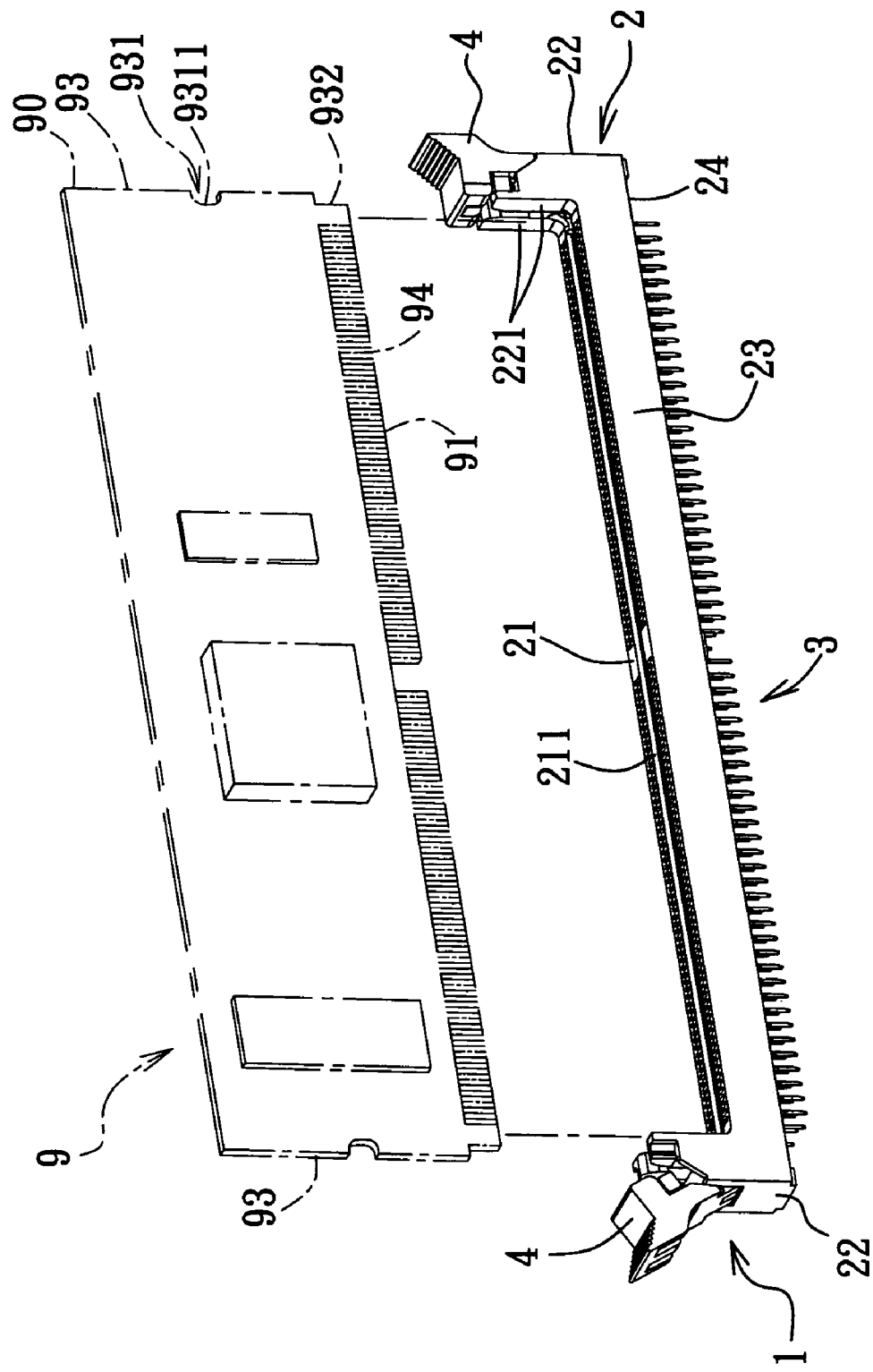
FIG. 3 is a perspective view showing the preferred embodiment of a card connector according to the present invention.

Referring to FIG. 3, the preferred embodiment of a card connector 1 according to the present invention is shown to be adapted for use with an electronic card 9, such as an FB DIMM card, having a rectangular card body 90. The card body 90 has an insertion side 91 formed with a plurality of conductive terminals 94, and opposite lateral sides 93, each of which is formed with a groove 931 and a notch 932. The groove 931 is defined by a groove-defining wall 9311. The card connector 1 includes a card-mounting seat 2, a plurality of conductive members 3, and two anchoring blocks 4.

Figure 4:
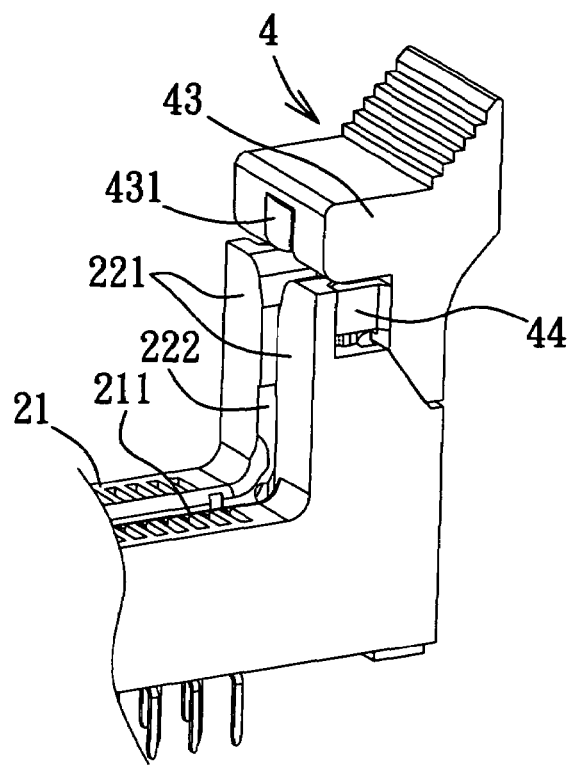
FIG. 4 is a fragmentary perspective view showing the preferred embodiment.
Figure 5:
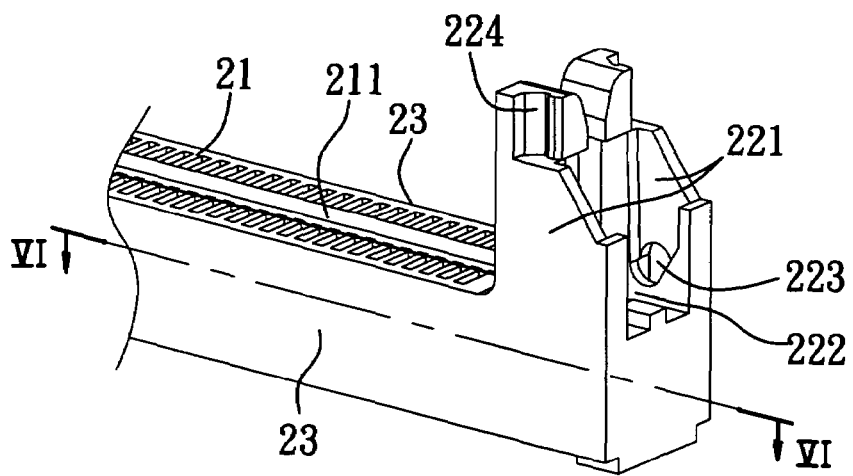
FIG. 5 is a fragmentary view showing a card-mounting seat of the preferred embodiment.
Figure 6:
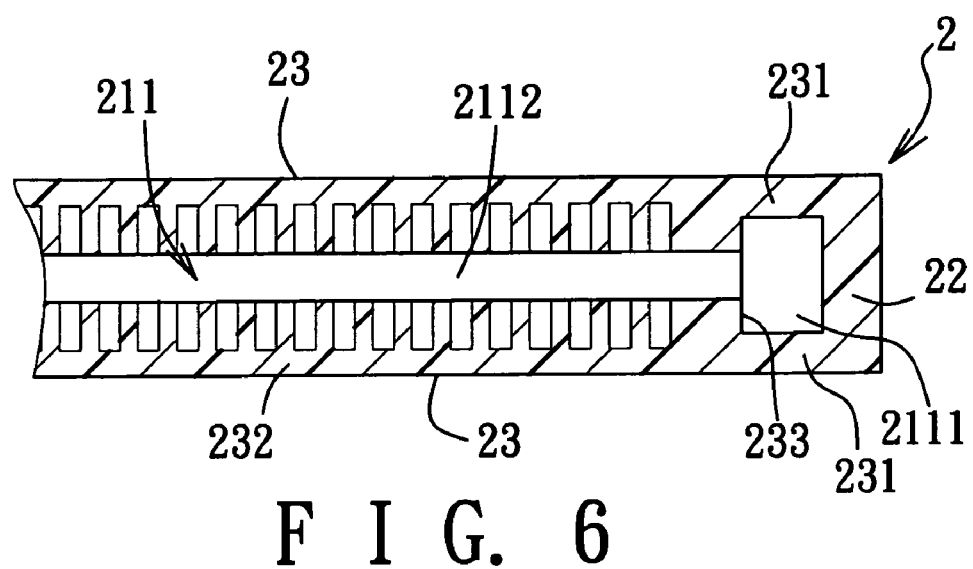
FIG. 6 is a fragmentary schematic sectional view taken along line VI-VI in FIG. 5.

With further reference to FIGS. 4 and 5, the card-mounting seat 2 has a top surface 21 formed with an insertion groove 211 that is defined by opposite end walls 22, opposite side walls 23 and a bottom wall 24, and that is adapted to permit insertion of the insertion side 91 of the card body 90 of the electronic card 9 thereinto, as shown in FIG. 3. Each of the end walls 22 has two opposite upright extension wall portions 221 that extend upwardly and that are aligned respectively with the side walls 23. The extension wall portions 221 of each end wall 22 define a receiving groove 222 therebetween. Each receiving groove 222 is in spatial communication with the insertion groove 211, as best shown in FIG. 4. In this embodiment, each of the extension wall portions 221 of the end walls 22 is formed with an engaging groove 224 and a pivot hole 223, as best shown in FIG. 5. With further reference to FIG. 6, each of the side walls 23 has opposite end portions 231 (only one is shown), and an intermediate portion 232 thicker than the end portions 231, and two shoulder portions 233 (only one is shown) each interconnecting the intermediate portion 232 and a corresponding one of the end portions 231 such that the insertion groove 211 in the card-mounting seat 2 has opposite widened end portions 2111 (only one is shown), and a narrowed intermediate portion 2112 having a width smaller than that of the widened end portions 2111. In this embodiment, each of the shoulder portions 233 of each side wall 23 is an inclined face, as shown in FIG. 9.

Figure 8:
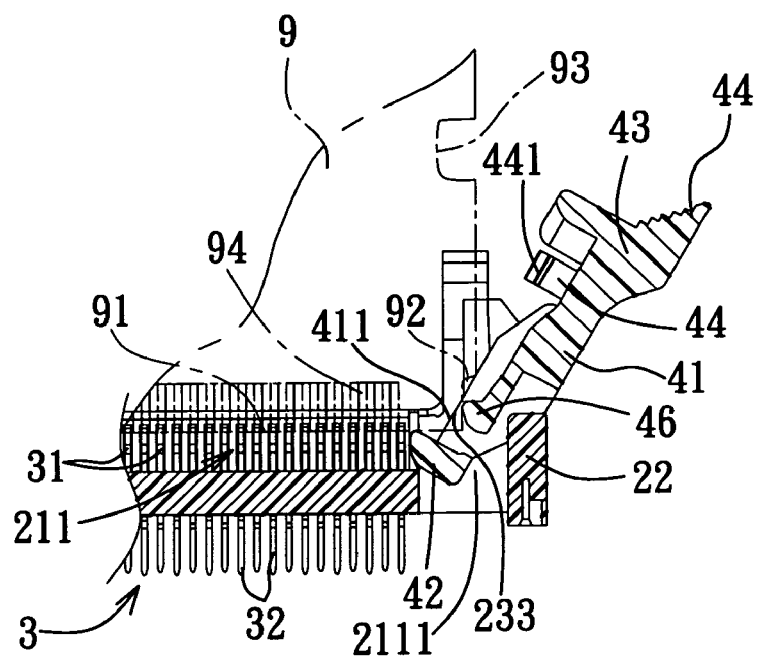
FIG. 8 is a fragmentary schematic sectional view showing the preferred embodiment when the anchoring block is in a releasing position.

With further reference to FIG. 8, the conductive members 3 are mounted in the card-mounting seat 2. Each conductive member 3 has a contact end portion 31 extending into the insertion groove 211 in the card-mounting seat 2, and a connecting end portion 32 opposite to the contact end portion 31 and extending outwardly of the card-mounting seat 2 through the bottom wall 24 of the card-mounting seat 2. The contact end portions 31 of the conductive members 3 are adapted to contact electrically and respectively the conductive terminals 94 of the electronic card 9 when the insertion side 91 of the card body 90 of the electronic card 9 is inserted into the insertion groove 211 in the card-mounting seat 2.

Figure 7:
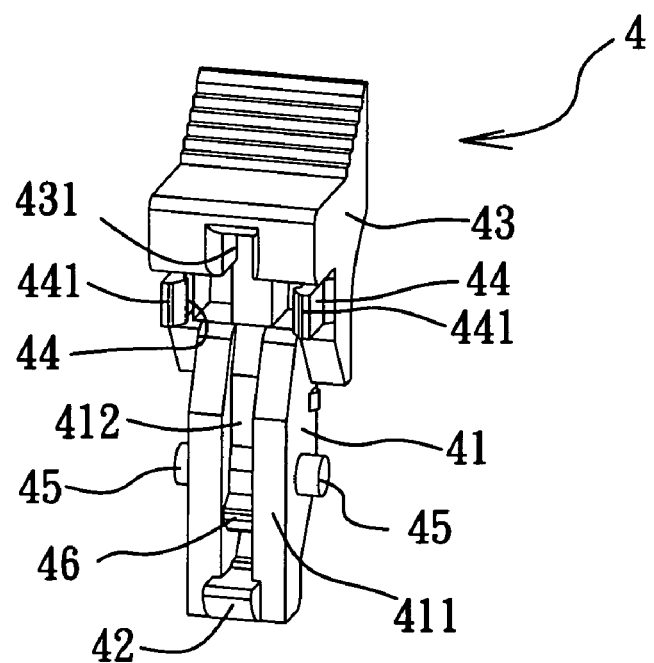
FIG. 7 is a perspective view showing an anchoring block of the preferred embodiment.
Figure 9:
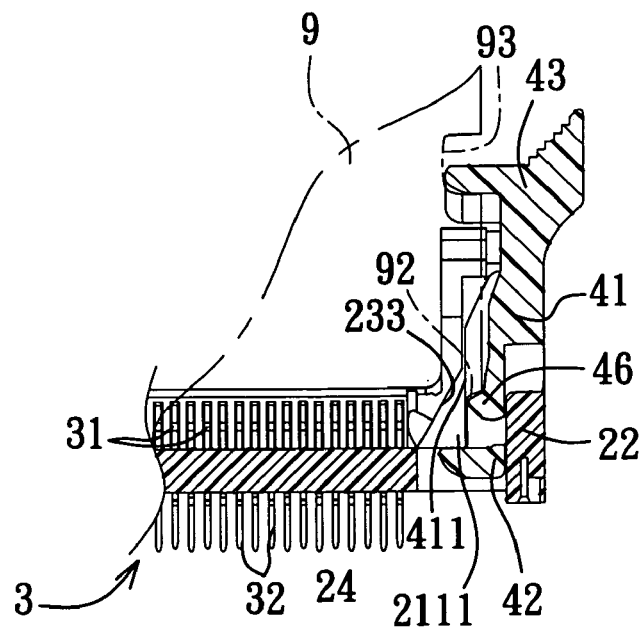
FIG. 9 is a fragmentary schematic sectional view showing the preferred embodiment when the anchoring block is in an anchoring position.

With further reference to FIGS. 7 to 9, each of the anchoring blocks 4 is connected pivotally to the extension wall portions 221 of a corresponding one of the end walls 22 of the card-mounting seat 2, as best shown in FIG. 4. Each anchoring block 4 has an operating end portion 43 that extends outwardly of a corresponding one of the receiving grooves 222, an ejecting end portion 42 opposite to the operating end portion 43 and disposed movably in a corresponding one of the widened end portions 2111 of the insertion groove 211 in the card-mounting seat 2, and an intermediate coupling portion 41 interconnecting the operating end portion 43 and the ejecting end portion 42, disposed in the corresponding one of the receiving grooves 222, and extending into the corresponding one of the widened end portions 2111 of the insertion groove 211 in the card-mounting seat 2. When the insertion side 91 of the card body 90 of the electronic card 9 is inserted into the insertion groove 211 in the card-mounting seat 2, the operating end portions 43 of the anchoring blocks 4 are operable so as to enable each of the anchoring blocks 4 to move between an anchoring position, where the operating end portions 43 of the anchoring blocks 4 are moved toward each other such that the card body 90 of the electronic card 9 is anchored between the operating end portions 43 of the anchoring blocks 4, and where the ejecting end portions 42 of the anchoring blocks 4 are adapted to abut against the insertion side 91 of the card body 90 of the electronic card 9, as shown in FIG. 9, and a releasing position, where the operating end portions 43 of the anchoring blocks 4 are moved away from each other, and where the ejecting end portions 42 of the anchoring blocks 4 are moved inwardly and upwardly toward each other such that the insertion side 91 of the card body 90 of the electronic card 9 is pushed upwardly by the ejecting end portions 42 of the anchoring blocks 4 to separate from the insertion groove 211 in the card-mounting seat 2, as shown in FIG. 8.

In this embodiment, each anchoring block 4 has opposite pivot rods 45 that extend away from each other (see FIG. 7) and that engage pivotally and respectively the pivot holes 23 in the extension wall portions 221 of the corresponding one of the end walls 22 of the card-mounting seat 2.

In this embodiment, the operating end portion 43 of each anchoring block 4 has opposite resilient clamping plates 44, each of which has a hook end 441 that engages the engaging groove 224 in a corresponding one of the extension wall portions 221 of the end walls 22 of the card-mounting seat 2 when each anchoring block 4 is disposed in the anchoring position. As such, the clamping plates 44 of the operating end portion 43 of each anchoring block 4 clamp the extension wall portions 221 of the corresponding one of the end walls 22 of the card-mounting seat 2 therebetween. The operating end portion 43 of each anchoring block 4 further has an anchoring notch 431 that is adapted to engage the groove-defining wall 9311 of a corresponding one of the lateral sides 93 of the card body 90 of the electronic card 9 when each anchoring block 4 is disposed in the anchoring position such that the card body 90 of the electronic card 9 is anchored to the insertion groove 211 in the card-mounting seat 2, as shown in FIG. 9.

In this embodiment, the intermediate coupling portion 41 of each anchoring block 4 has an inner side surface 411 formed with an engaging groove 412 that is in spatial communication with the insertion groove 211 in the card-mounting seat 2 and that is adapted to engage a part of the corresponding one of the lateral sides 93 of the card body 90 of the electronic card 2 when each anchoring block 4 is disposed in the anchoring position, and a protrusion 46 that extends from the engaging groove 412 and that is adapted to engage the notch 932 in the corresponding one of the lateral sides 93 of the card body 90 of the electronic card 9 when each anchoring block 4 is disposed in the anchoring position.

In sum, due to the presence of the protrusion 46 of each anchoring block 4, the card connector 1 only permits complete engagement with the electronic card 9 with the notches 932. As such, the card connector 1 of this invention can effectively avoid insertion of other electronic cards, which have the same size as the electronic card 9 but does not have the requisite notches 932, such as a DDR electronic card, into the insertion groove 211 in the card-mounting seat 2.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A card connector for an electronic card having a rectangular card body, the card body having an insertion side formed with a plurality of conductive terminals, and opposite lateral sides, one of which is formed with a notch disposed adjacent to the insertion side of the card body, said card connector comprising:

a card-mounting seat having a top surface formed with an insertion groove, which is defined by opposite end walls, opposite side walls and a bottom wall, and which permits insertion of the insertion side of the card body of the electronic card thereinto, each of said end walls having two opposite upright extension wall portions that extend upwardly and that are aligned respectively with said side walls, said extension wall portions of each of said end walls defining a receiving groove therebetween, each of said receiving grooves being in spatial communication with said insertion groove;

a plurality of conductive members mounted in said card-mounting seat, each of said conductive members having a contact end portion extending into said insertion groove in said card-mounting seat, and a connecting end portion opposite to said contact end portion and extending outwardly of said card-mounting seat through said bottom wall of said card-mounting seat, said contact end portions of said conductive members being adapted to contact electrically and respectively the conductive terminals of the electronic card when the insertion side of the card body of the electronic card is inserted into said insertion groove in said card-mounting seat; and two anchoring blocks each connected pivotally to said extension wall portions of a corresponding one of said end walls of said card-mounting seat, each of said anchoring blocks having an operating end portion that extends outwardly of a corresponding one of said receiving grooves, an ejecting end portion opposite to said operating end portion and disposed in said insertion groove in said card-mounting seat, and an intermediate coupling portion interconnecting said operating end portion and said ejecting end portion, disposed in the corresponding one of said receiving grooves, and extending into said insertion groove in said card-mounting seat;

wherein, when the insertion side of the card body of the electronic card is inserted into said insertion groove in said card-mounting seat, said operating end portions of said anchoring blocks are operable so as to enable each of said anchoring blocks to move between an anchoring position, where said operating end portions of said anchoring blocks are moved toward each other such that the card body of the electronic card is anchored between said operating end portions of said anchoring blocks, and where said ejecting end portions of said anchoring blocks are adapted to abut against the insertion side of the card body of the electronic card, and a releasing position, where said operating end portions of said anchoring blocks are moved away from each other, and where said ejecting end portions of said anchoring blocks are moved inwardly and upwardly toward each other such that the insertion side of the card body of the electronic card is pushed upwardly by said ejecting end portions of said anchoring blocks to separate from said insertion groove in said card-mounting seat;

wherein said intermediate coupling portion of one of said anchoring blocks has a protrusion that is adapted to engage the notch in said one of the lateral sides of the card body of the electronic card when said one of said anchoring blocks is disposed in the anchoring position.

2. The card connector as claimed in claim 1, wherein said intermediate coupling portion of each of said anchoring blocks has an inner side surface formed with an engaging groove that is in spatial communication with said insertion groove in said card-mounting seat and that is adapted to engage a part of a respective one of the lateral sides of the card body of the electronic card when each of said anchoring blocks is disposed in the anchoring position, said protrusion extending from said engaging groove in said intermediate coupling portion of said one of said anchoring blocks.

3. The card connector as claimed in claim 1, wherein said operating end portion of each of said anchoring blocks has opposite resilient clamping plates that clamp said extension wall portions of the corresponding one of said end walls of said card-mounting seat therebetween when each of said anchoring blocks is disposed in the anchoring position.

4. The card connector as claimed in claim 3, wherein:

each of said extension wall portions of said end walls of said card-mounting seat is formed with an engaging groove;

each of said clamping plates of said operating end portions of said anchoring blocks has a hook end that engages said engaging groove in a corresponding one of said extension wall portions of said end walls of said card-mounting seat when each of said anchoring blocks is disposed in the anchoring position.

5. The card connector as claimed in claim 2, wherein each of said side walls has opposite end portions, and an intermediate portion thicker than said end portions, and two shoulder portions each interconnecting said intermediate portion and a corresponding one of said end portions such that said insertion groove in said card-mounting seat has opposite widened end portions, each of which receives said ejecting end portion and said intermediate coupling portion of a corresponding one of said anchoring blocks, and a narrowed intermediate portion having a width smaller that of said widened end portions, said shoulder portions of each of said side walls abutting respectively against said inner side surfaces of said intermediate coupling portions of said anchoring blocks when each of said anchoring blocks is disposed in the releasing position.

6. The card connector as claimed in claim 1, wherein:

each of said extension wall portions of said end walls of said card-mounting seat is formed with a pivot hole; and each of said anchoring blocks is formed with opposite pivot rods that extend away from each other and that engage pivotally and respectively said pivot holes in said extension wall portions of the corresponding one of said end walls of said card-mounting seat.

* * * * *